United States Patent [19]

Hayashi

[11] 4,443,732
[45] Apr. 17, 1984

[54] TEMPERATURE-COMPENSATED CRYSTAL RESONATOR UNIT

[75] Inventor: Hitoaki Hayashi, Tokyo, Japan

[73] Assignee: Asahi Dempa Co., Ltd., Tokyo, Japan

[21] Appl. No.: 520,598

[22] Filed: Aug. 5, 1983

[30] Foreign Application Priority Data

Feb. 22, 1983 [JP] Japan .................................. 58-26921
Mar. 16, 1983 [JP] Japan .................................. 58-42420

[51] Int. Cl.³ ............................................ H01L 41/08
[52] U.S. Cl. ..................................... 310/343; 219/210
[58] Field of Search ................................ 310/340–343, 310/346; 219/210; 236/1 F; 331/69, 70

[56] References Cited

U.S. PATENT DOCUMENTS

3,414,706 12/1968 Flanagan et al. ............... 310/343 X
3,749,879 7/1973 Armstrong ..................... 310/343 X Primary Examiner—Mark O. Budd
Attorney, Agent, or Firm—Stevens, Davis, Miller & Mosher

[57] ABSTRACT

The disclosed temperature-compensated crystal resonator unit has a crystal resonator element with a first ceramic member attached thereto, which resonator element is housed in a vessel with a second ceramic member being mounted on the housing and electrically connected to said first ceramic member in series thereto, both of said first and second ceramic members having positive temperature coefficients of electric resistance, said second ceramic member being mechanically separated from both the first ceramic member and the crystal resonator element.

4 Claims, 13 Drawing Figures

Resistance of 1st Ceramic Member / Resistance of 2nd Ceramic Member

FIG. 4B

Temperature of Crystal Resonator Element

FIG. 4C

Deviation of Oscillating Frequency $(\times 10^{-6})$

FIG_9A

FIG_9B

— 4,443,732 —

TEMPERATURE-COMPENSATED CRYSTAL RESONATOR UNIT

BACKGROUND OF THE INVENTION

1. Field of the Invention

This invention relates to a temperature-compensated crystal resonator unit, and more particularly to a small and inexpensive crystal resonator unit with a high temperature gain. In a crystal resonator unit according to the present invention, the temperature variation of a crystal resonator element thereof is kept small for variation of the ambient temperature of the unit, so that the frequency fluctuation of the unit for ambient temperature variation is minimized.

2. Description of the Prior Art

To suppress the frequency fluctuation of oscillation of a crystal resonator for variation of ambient temperature thereof, it has been known to form a temperature-compensated crystal resonator unit by combining a crystal resonator element with a ceramic heater with a positive temperature coefficient of electric resistance (to be referred to as a "ceramic member with a positive coefficient", hereinafter), which ceramic heater fulfills the function of self-temperature compensation. Different types of temperature-compensated crystal resonator unit have been known heretofore. In a typical conventional temperature-compensated crystal resonator unit, a crystal resonator plate element is housed in a vessel and a ceramic member with a positive coefficient is attached to the outer surface of the vessel in a heat-conductive manner, and this vessel is simply placed in a larger container. In another type of conventional temperature-compensated crystal resonator unit, a crystal resonator element is simply housed in a vessel having a ceramic member with a positive coefficient mounted thereon in a heat-conductive manner. It is also known to wind a regular metallic heater wire around a crystal resonator element and to attached a ceramic with a positive coefficient to the crystal resonator element in a heat-conductive manner, and to electrically connect the heater wire and the ceramic member in parallel.

In any of the above-mentioned conventional type crystal resonator units, when its ambient temperature thereof varies over a range of $-30°$ C. to $+60°$ C., the temperature of its crystal resonator element varies between 30° C. and 40° C. Thus, even after very careful adjustment, a temperature variation of about 10° C. or more is inevitable at the crystal resonator element. Accordingly, the temperature gain of the conventional crystal resonator unit is usually 2 to 3, and even when very careful adjustment is made, the temperature gain is 7 to 8.5 at most. Here, the temperature gain is given by $$\text{Temperature gain} = \frac{\text{Variation of ambient temperature}}{\text{Variation of crystal resonator element temperature}}.$$

Consequently, the oscillating frequency of the crystal resonator element fluctuates considerably with the ambient temperature variation.

It is also known to form a crystal resonator unit by combining a regular heater element with an electronic temperature control means, so as to reduce the fluctuation of the oscillating frequency of the resonator unit even when the ambient temperature varies. This type of the crystal resonator unit using the electronic temperature control means can provide a very high temperature gain, but it has shortcomings in that the unit becomes large and costly, so that its use has been limited to some special fields.

Accordingly, there has been a pressing need for a crystal resonator unit having a high temperature gain and yet being small in size and low in cost.

SUMMARY OF THE INVENTION

Therefore, an object of the present invention is to obviate the above-mentioned shortcomings of the crystal resonator unit of the prior art.

Another object of the invention is to meet the above-mentioned need by providing a small and inexpensive crystal resonator unit having a high temperature gain.

To fulfill the above-mentioned objects, a preferred embodiment of the crystal resonator unit of the present invention uses a crystal resonator element having a first ceramic member attached thereto in a heat-conductive manner, which first ceramic member has a positive temperature coefficient of electric resistance, and the crystal resonator element with the first ceramic member is housed in a vessel. A second ceramic member having a positive temperature coefficient of electric resistance is mounted on said vessel in a heat-conductive manner, and the second ceramic member is electrically connected to the first ceramic member in series thereto. As an important feature of the invention, the second ceramic member is spaced from both said crystal resonator element and said first ceramic member.

In another embodiment of the invention, a crystal resonator unit uses a crystal resonator element housed in a vessel having at least one first ceramic member attached thereto in a heat-conductive manner, which first ceramic member has a positive temperature coefficient of electric resistance, and the crystal resonator element with the first ceramic member is housed in a vessel. At least one second ceramic member is mounted on said vessel in a heat-conductive manner, and the second ceramic member is electrically connected to said first ceramic member in series thereto, which second ceramic member also has a positive temperature coefficient of electric resistance. In addition, at least one third ceramic member having a positive temperature coefficient of electric resistance is mounted on said vessel in a heat-conductive manner, and the third ceramic member is electrically connected in parallel to a circuit formed of said first and second ceramic members. In this embodiment, it is an important feature that both of said crystal resonator element and said first ceramic member are spaced from any of said vessel, said second ceramic member and said third ceramic member.

BRIEF DESCRIPTION OF THE DRAWINGS

For a better understanding of the invention, reference is made to the accompanying drawings, in which.

Throughout different views of the drawings, 1 and 21 are crystal resonator elements, 2 and 22 are a first ceramic members with a positive temperature coefficient of electric resistance, 3 and 23 are vessels, 4 and 24 are bottoms of the vessels, 5, 5' and 25 are second ceramic members having a positive temperature coefficient of electric resistance, 6 and 26 are electric connectors, 7, 7', 29, and 29' are terminals of the crystal resonator element, 8 and 9 are terminals of the first and second ceramic members, 10 and 27 are covers, 11 and 34 are heat insulating layers, 28, 28', and 28" are third ceramic members with a positive temperature coefficient of electric resistance, 30 is a terminal connected to the vessel, 31 and 32 are lead wires, and 33 is a terminal insulated from the vessel.

DESCRIPTION OF THE PREFERRED EMBODIMENTS

Figure 1:
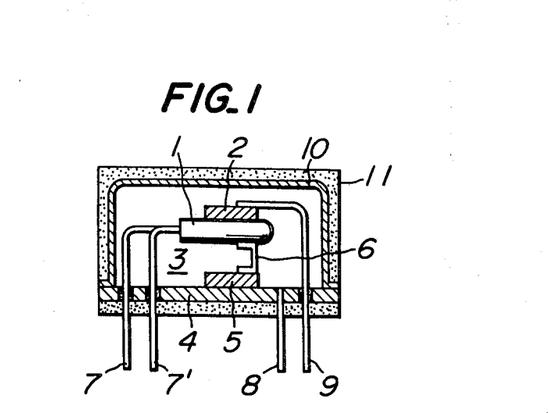
FIG. 1 is a schematic sectional view of a crystal resonator unit according to the present invention.

Referring to FIG. 1 showing a schematic sectional view of an embodiment of the crystal resonator unit according to the present invention, a crystal resonator element 1 has a metallic case, and a first ceramic member 2 with a positive temperature coefficient of electric resitance (to be referred to as the "first ceramic member", hereinafter) is attached to the outer surface of the metallic case in a heat-conductive manner. A metallic vessel 3 houses the crystal resonator element 1 and the first ceramic member 2, and the bottom 4 of the vessel 3 has a second ceramic member 5 with a positive temperature coefficient of electric resistance (to be referred to as the "second ceramic member", hereinafter) attached thereto in a heat-conductive manner. An electric connector 6 connects the first ceramic member 2 and the second ceramic member 5 in series. In the embodiment of FIG. 1, the metallic case of the crystal resonator element 1 is inserted between the electric connector 6 and the first ceramic member 2. The second ceramic member 5 is spaced from both of the crystal resonator element 1 and the first ceramic member 2, so that the second ceramic member 5 does not come into direct contact with either the crystal resonator element 1 or the first ceramic member 2.

Terminals 7 and 7' of the crystal resonator element 1 are secured to but electrically insulated from the bottom 4 of the vessel 3, so as to provide for the outside connection of the crystal resonator element 1. The serial circuit including the first ceramic member 2 and the second ceramic member 5 has one end terminal 8 thereof electrically connected to the bottom 4 of the metallic vessel 3 and an opposite end terminal 9 secured to but electrically insulated from the bottom 4 of the metallic vessel 3. The metallic vessel 3 has a cover portion 10 which is lined with a heat insulating layer 11, so as to keep the temperature in the vessel 3 as constant as possible.

The reason for serially connecting the first ceramic member 2 and the second ceramic member 5 and the reason for spacing both of the crystal resonator element 1 and the first ceramic member 2 from the second ceramic member 5 so as to eliminate any direct contact therebetween are to ensure a high temperature gain of the crystal resonator unit in the following manner; namely, when the ambient temperature is low, after a voltage is applied across the terminals 8 and 9 and the current through the unit is stabilized, the resistance of the first ceramic member 2 is larger than that of the second ceramic member 5, so that the voltage across the first ceramic member 2 represents most of the voltage thus applied to the terminals 8 and 9, and the first ceramic member 2 acts as a major heater for directly heating the crystal resonator element 1; while as the ambient temperature increases, the second ceramic member 5 senses the temperature rises of the metallic vessel 3 due to the heating by the first ceramic member 2 and the ambient temperature rise, and the resistance of the second ceramic member 5 increases and the voltage across the second ceramic member 5 assumes an increasingly larger portion of the voltage applied across the terminals 8 and 9, and the heat generation at the first ceramic member 2 gradually decreases for reducing the power for directly heating the crystal resonator element 1 by the first ceramic member 2, while reducing the overall heat generation to a great extent at high ambient temperatures. Whereby, a high temperature gain is provided in the crystal resonator unit of the invention.

It is important to select proper characteristics of the first and second ceramic members 2 and 5, such as the sizes, numbers, resistance values, and Curie points thereof, and to select proper thermal capacities of the crystal resonator element 1 and the vessel 3, so as to provide the conditions for ensuring the high temperature gain; namely, the conditions such that, when an actuating voltage is applied to the crystal resonator unit and the current therethrough is stabilized, if the ambient temperature is low, the resistance of the first ceramic member 2 is larger than that of the second ceramic member 5 so that the first ceramic member 2 acts as a major heat generator, while as the ambient temperature increases, the resistance of the second ceramic member 5 increases in such a manner that the share of the voltage across the second ceramic member 5 relative to the overall actuating voltage increases. Particularly, it is preferable to select such thermal capacity of the crystal resonator element 1 which is smaller than that of the vessel 3.

The heat-conductive joint between the crystal resonator element 1 and the first ceramic member 2 and the heat-conductive joint between the vessel 3 and the second ceramic member 5 can be formed by any of conventional means: for instance, by using electrically conductive adhesive of known kind, by soldering, by fastening with the pressure of metallic spring members, by binding with electrically insulating materials of known type, or by using heat-conductive but electrically insulating adhesive. When electrically insulating adhesive is used to make the joint, a suitable electric connecting means such as regular lead wires can be used to provide electric connection across the joint.

Figure 2:
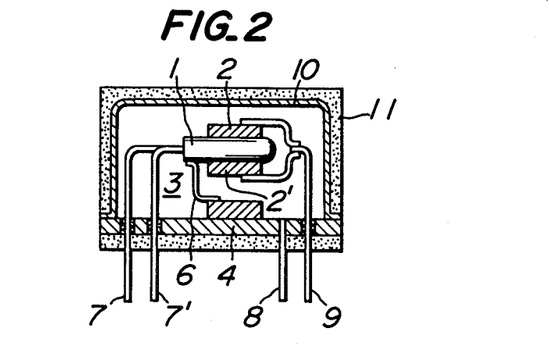
FIGS. 2 and 3 are schematic sectional views of difference embodiments of the crystal resonator unit of the invention.
Figure 3:
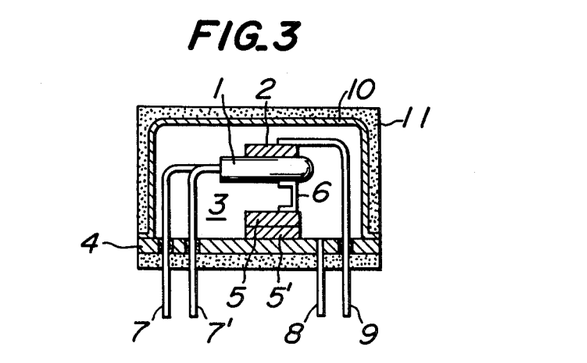

As to the number of the first ceramic member 2 and the second ceramic member 5 in one crystal resonator unit, it is preferable from the standpoint of economy to use one of each of such ceramic members in each resonator unit as in the case of the embodiment of FIG. 1. It is also possible to use a plurality of such ceramic members in one resonator unit of the invention. For instance, a pair of the first ceramic members 2 and 2' can be attached to the opposing surfaces of the crystal resonator element 1, as shown in FIG. 2; or a plurality of the second ceramic members 5 and 5' can be secured to the vessel 3, as shown in FIG. 3. When a plurality of the first ceramic members 2, 2' and the second ceramic members 5, 5' are used, the first ceramic members must be connected in series to the second ceramic members, or the electric connection between the ceramic members of these two different kinds should be serial. However, among the first ceramic members 2, 2', the electrical or mechanical connection therebetween can be either in parallel or in series relative to each other, and the same is applicable to the connection among the second ceramic members alone.

The Curie points of the ceramic members 2 and 5 can be selected with a criterion of minimizing the influence of the ambient temperature variation on the temperature of the crystal resonator element 1, and the Curie point of the first ceramic member 2 can the same as or different from that of the second ceramic member 5. However, it is preferable to select the Curie point of the second ceramic member 5 that is the same as or 5°-15° C. lower than the Curie point of the first ceramic member 2, so as to cause the resistance of the second ceramic member 5 to vary in response to ambient temperature variation with a high sensitivity. Since the operating temperature of the crystal resonator element 1 is preferably below 80° C. for regular applications, the Curie points of the first and second ceramic members 2 and 5 should preferably be below 80° C., more preferably below 60° C.

The material of the vessel 3 is not restricted to metals alone. For instance, the bottom 4 of the vessel 3 is made of a suitable metallic material and the cover 10 thereof is made of a suitable resin material, or the entire vessel 3 may be made of resin material or ceramics. A part of or entire outer surface of the vessel 3 may be lined with suitable heat insulating material layer 11. To prevent transfer of heat, the structure of the vessel 3 may be made like that of a Dewar vessel or a vacuum bottle. It is known that the thermal capacity of the vessel 3 should preferably be larger than the thermal capacity of the crystal resonator element 1, because this relationship between the thermal capacities of the vessel 3 and the element 1 has been found to facilitate the provision of such resistance of the first ceramic member 2 that is larger than that of the second ceramic member 5 at low temperatures in the operating temperature range when an actuating voltage is applied thereto and the current therethrough is stabilized. To increase the thermal capacity of the vessel 3 by using the second ceramic member 5 with a large thermal capacity, a heat sink (not shown) may be attached to the second ceramic member 5.

Figure 5:
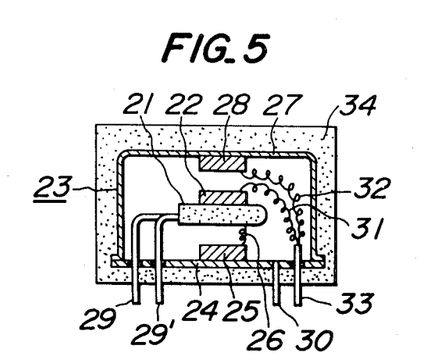
FIG. 5 is a schematic sectional view of another embodiment of the crystal resonator unit of the invention, which embodiment uses a third ceramic member.

FIG. 5 shows a schematic sectional view of another embodiment of the crystal resonator unit according to the present invention. In this embodiment, a crystal resonator element 21 has a metallic case, and a first ceramic member 22 with a positive temperature coefficient of electric resistance (to be referred to as the "first ceramic member", hereinafter) is secured to the outer surface of the metallic case of the crystal resonator element 1 in thermally and electrically conductive manner. A metallic vessel 23 houses the crystal resonator element 21 and the first ceramic member 22. Bottom 24 of the vessel 23 has a second ceramic member 25 with a positive temperature coefficient of electric resistance (to be referred to as the "second ceramic member", hereinafter) secured thereto in thermally and electrically conductive manner. The first ceramic member 22 and the second ceramic member 25 are connected in series through a lead wire 26 and the metallic case of the crystal resonator element 1. The vessel 23 includes a cover 27 which carries a third ceramic member 28 with a positive temperature coefficient of electric resistance (to be referred to as the "third ceramic member", hereinafter) in thermally and electrically conductive member. The third ceramic member 28 is electrically connected in parallel to the serial circuit including the first ceramic member 22 and the second ceramic member 25.

Both of the crystal resonator element 21 and the first ceramic member 22 are spaced from any of the second ceramic member 25, the third ceramic member 28, and the vessel 23 carrying the second and third ceramic members 25 and 28 in a thermally conductive manner, so that both the crystal resonator element 21 and the first ceramic member 22 do not come into direct contact with any of the vessel 23, the second ceramic member 25, and the third ceramic member 28. The terminals 29 and 29' of the crystal resonator element 21 are secured to but electrically insulated from the base 24 of the metallic vessel 23, so as to facilitate connection to the outside circuit. Both of the second ceramic member 25 and the third ceramic member 28 have one side surfaces thereof secured to the metallic vessel 23 in an electrically conductive manner, and terminal 30 which is electrically conductively connected to the metallic vessel 23 facilitates electric connection of the second and third ceramic members 25 and 28 to the outside circuit. In the embodiment of FIG. 5, lead wires 31 and 32 have one ends thereof joined in common, and such common ends are connected to another terminal 33 which is fixed to the vessel 23 in an electrically insulated menner. The opposite end of the lead wire 31 is connected to that surface of the first ceramic member 22 which is opposite to the surface in contact with the metallic case of the crystal resonator element 21, and the opposite end of the lead wire 32 is connected to that surface of the third ceramic member 28 which is opposite to the surface in contact with the metallic vessel 23. The entire outer surface of the vessel 33 is covered with a heat insulating member layer 34.

The reason for serially connecting the first ceramic member 22 and the second ceramic member 25 and the reason for spacing both of the second ceramic member 25 and the vessel 23 from either of the crystal resonator element 21 and the first ceramic member 22 so as to eliminate any direct contact therebetween are to ensure a high temperature gain of the crystal resonator unit in the following manner; namely, when the ambient temperature is low, after a voltage is applied across the terminals 30 and 33 and the current through the unit is stabilized, the resistance of the first ceramic member 22 is larger than that of the second ceramic member 25, so that the voltage across the first ceramic member 22 represents most of the voltage thus applied to the terminals 30 and 33, and the first ceramic member 22 acts as a major heater for directly heating the crystal resonator element 21; while as the ambient temperature increases, the second ceramic member 25 senses the temperature rise of the metallic vessel 23 due to the heating by the first ceramic member 22 and the high ambient temperature, and the resistance of the second ceramic member 25 increases and the voltage across the second ceramic member 25 assumes an increasingly larger portion of the voltage applied across the terminals 30 and 33, and the heat generation at the first ceramic member 22 gradually decreases for reducing the power for directly heating the crystal resonator element 21 by the first ceramic member 22, which reducing the overall heat generation to a great extent at high ambient temperature. Whereby, a high temperature gain is provided in the crystal resonator unit of the invention.

It is important to select proper characteristics of the first and second ceramic members 22 and 25, such as the sizes, numbers, resistance values, and Curie points thereof, and to select proper thermal capacities of the crystal resonator element 21 and the vessel 23, so as to provide the conditions for ensuring the high temperature gain; namely, the conditions such that, when an actuating voltage is applied to the crystal resonator unit and the current therethrough is stabilized, if the ambient temperature is low, the resistance of the first ceramic member 22 is larger than that of the second ceramic member 25 so that the first ceramic member 22 acts as a major heat generator, while as the ambient temperature increases, the resistance of the second ceramic member 25 increases in such a manner that the share of the voltage across the second ceramic member 25 relative to the overall actuating voltage increases. Particularly, it is preferable to select such thermal capacity of the crystal resonator element 21 which is smaller than that of the vessel 23.

The reason for using the electric parallel connection of the third ceramic member 28 to the serial circuit including the first ceramic member 22 and the second ceramic member 25 is to further increase the temperature gain of the crystal resonator unit materialized by the first and second ceramic member 22 and 25. The reason for avoiding any direct contact of the third ceramic member 28 with either the first ceramic member 22 or the crystal resonator element 21 is in that, if the above-mentioned direct contact exists, the mutual thermal interference between the first ceramic member 22 and the third ceramic member 28 becomes too strong to produce the desired high temperature gain.

The criterion for selecting the characteristics of the third ceramic member 28, such as the size, the number, the resistance value, and the Curie point thereof, is to further improve that temperature characteristics of the crystal resonator unit which is materialized by the use of serial circuit including the first and second ceramic members 22 and 25.

The heat-conductive joints between the crystal resonator element 21 and the first ceramic member 22, between the vessel 23 and the second ceramic member 25, and between the vessel 23 and the third ceramic member 28 can be formed by any of conventional means; for instance, by using electrically conductive adhesive of known kind, by soldering, by fastening with the pressure of metallic spring members, by binding with electrically insulating materials of known type, or by using heat-conductive but electrically insulating adhesive. When electrically insulating adhesive is used to make the joint, a suitable electric connecting means such as regular lead wires can be used to provide electric connection across the joint.

Figure 6:
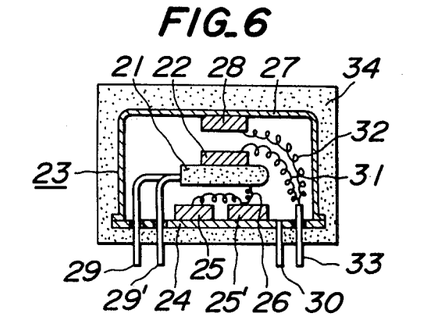
FIG. 6 and FIG. 7 are schematic sectional views of two difference modifications of the embodiment of FIG. 5.
Figure 7:
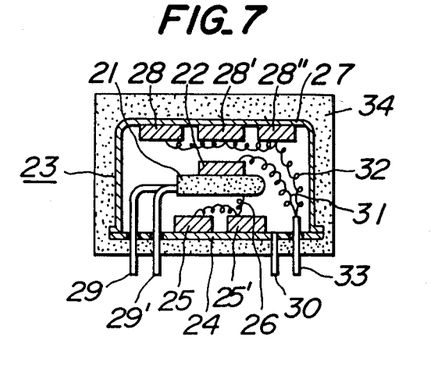

As to the number of the first ceramic member 22, the second ceramic member 25, and the third ceramic member 28, it is preferable from the standpoint of economy to use one of each of such ceramic members in one crystal resonator unit, as shown in the embodiment of FIG. 5. It is also possible to use a plurality of each of them in one crystal resonator unit of the invention. For instance, a pair of the second ceramic members 25 and 25' can be attached to the bottom 24 of the vessel 23, as shown in FIG. 6; or in addition to the plurality of the second ceramic members 25 and 25' attached to the bottom 24 of the vessel 23, three third ceramic members 28, 28' and 28" can be mounted on the cover 27 of the vessel 23, as shown in FIG. 7. When a plurality of the first ceramic members 22, 22' and the second ceramic members 25, 25' are used, the first ceramic members must be electrically connected in series to the second ceramic members. The three third ceramic members 28, 28', and 28" must be connected in parallel to the serial circuit including the first and second ceramic members. The electrical and mechanical connections between the ceramic members of the same kind, such as between first ceramic members, between second ceramic members, and between third ceramic members, can be either in parallel or in series relative to each other.

The mounting positions of the second and third ceramic members 25 and 28 are not restricted to the bottom 24 and the cover 27 of the vessel 23, and they can be mounted, for instance, on side portions of the vessel 23. Besides, it is not necessary to separate the position of the second ceramic member 25 from the position of the third ceramic member 28, such as the bottom 24 and the cover 27. In short, it is sufficient for the purpose of the invention to design the positions of the second and third ceramic members 25 and 28 so as to ensure easy assembly and simple wiring.

The Curie points of the first, second, and third ceramic members 22, 25, and 28 can be selected with a criterion of minimizing the influence of the ambient temperature variation on the temperature of the crystal resonator element 21, and the Curie points of the first, second, and third ceramic members can be the same as or different from each other. However, it is preferable to select the Curie points of the second and third ceramic member 25 and 28 which are same as or 5°–20° C. lower than the Curie point of the first ceramic member 22. Since the operating temperature of the crystal resonator element 21 is preferably below 80° C. for regular applications, the Curie points of the first, second, and third ceramic members 22, 25, and 28 should preferably be below 70° C., more preferably below 50° C.

The material of the vessel 23 is not restricted to metals alone. For instance, a part of the vessel 23 or the entire vessel 23 may be made of resin material or ceramics. A part of or entire outer surface of the vessel 23 may be lined with suitable heat insulating material layer 34. Although such heat insulating lining is effective in reducing the electric power necessary for keeping the crystal resonator element 21 at a constant temperature, the heat insulating lining can be dispensed with in the crystal resonator unit of the invention. To prevent transfer of heat, the structure of the vessel 23 may be made like that of a Dewar vessel or a vacuum bottle.

The invention will be described in further detail now by referring to examples.

EXAMPLE 1

A sample of the temperature—compensated resonator unit according to the present invention was prepared by bonding a first ceramic member, with a diameter of 6 mm and a thickness of 1 mm, to a crystal resonator element of type HC-45/U by an electrically conductive adhesive, which first ceramic member had a resistance of 20Ω at 25° C. and a Curie point of 30° C.; housing the thus bonded crystal resonator element and the first ceramic member in a metallic vessel of 10×15×15 mm; bonding a second ceramic member to the inner surface of the bottom of the metallic vessel by an electrically conductive adhesive, which second ceramic member had the same size, the electric resistance, and the same Curie point, as those of the first ceramic member; electrically connecting the first and second ceramic members in series; and thermally insulating the unit by enclosing the outer surface of the metallic vessel with a formed silicone rubber layer with a thickness of 2 mm.

Figure 4A:
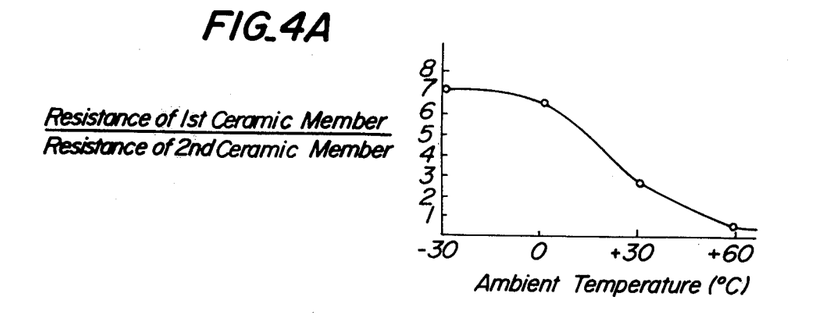
FIGS. 4A, 4B, and 4C are graphs indicating the operating characteristics of examples of the crystal resonator unit of the invention.
Figure 4B:
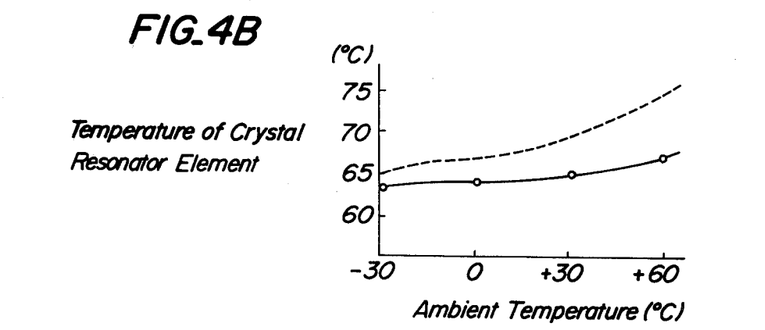
Figure 4C:
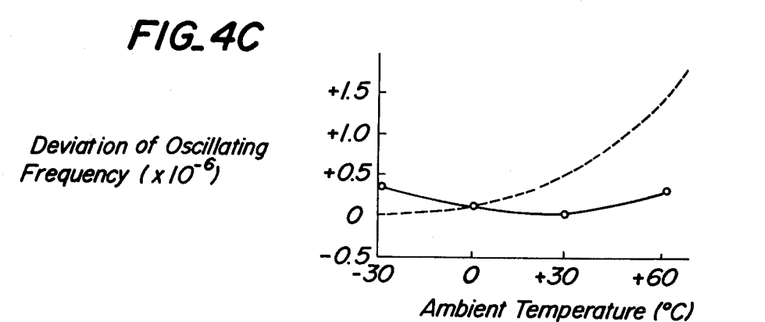

The operating characteristics of the sample of the invention thus prepared was tested by applying an actuating voltage of 13.5 V across the serial circuit including the first and second ceramic members and by varying the ambient temperature from −30° C. to +60° C. The result is shown in FIGS. 4A, 4B, and 4C: namely, the electric resistance of the first ceramic member was 7 times that of the second ceramic member at low temperatures and 0.9 time at +60° C., as shown in FIG. 4A; the temperature gain of the sample was 22.5 because the variation of the temperature of the crystal resonator element was 65° C.±2° C. when the ambient temperature varied 90° C. from −30° C. to +60° C.; and the oscillating frequency was very stable because its deviation was less than 0.3 ppm. The power consumption was very small, i.e., 0.4 W at −30° C. and 0.06 W at +60° C.

For reference, a conventional crystal resonator unit was made by using the same construction as that of the above-mentioned sample of the invention except the elimination of the second ceramic member, namely by using only the first ceramic member. The temperature gain of the reference unit was very small, namely only 9, because the temperature of the crystal resonator element varied 70° C.±5° C. for the same ambient temperature change as that for the test of the sample of the invention, as shown by the dotted line of FIG. 4B. The deviation of the oscillating frequency of the reference unit was rather large, more specifically 1.5 ppm, as shown by the dotted line of FIG. 4C.

EXAMPLE 2

Another sample of the temperature-compensated resonator unit according to the present invention was prepared by bonding a first porcelan member, with a diameter of 8 mm and a thickness of 1 mm, to a crystal resonator element of type HC-45/U by welding, which first ceramic member hand a resistance of 20Ω at 25° C. and a Curie point of 35° C.; housing the thus bonded crystal resonator element and the first ceramic member in a metallic vessel of 10×15×20 mm; bonding a second ceramic member to the inner surface of the bottom of the metallic vessel by welding, which second ceramic member had a resistance of 40Ω at 25° C. the size and the Curie points of the second ceramic member being the same as those of the first ceramic member; and electrically connecting the first and second ceramic members in series.

The operating characteristics of the sample of the invention thus prepared was tested by applying an actuating voltage of 13.5 V across the serial circuit including the first and second ceramic members and by varying the ambient temperature from −30° C. to +60° C. The sample had a good temperature gain of about 13 because the variation of the temperature of the crystal resonator element thereof was between 65° C.+5° C. and 65° C.−2° C.

A reference resonator unit was made by using the same constructiofn as the above-mentioned sample of the invention except that the first and second ceramic members were electrically connected in parallel to each other. The temperature gain of the reference unit was very small, namely only 6, because the temperature of the crystal resonator element varied between 75° C.+10° C. and 75° C.−5° C., and the center of the temperature change of the crystal resonator element was shifted considerably.

EXAMPLE 3

Another sample of the temperature-compensated resonator unit according to the present invention as shown in FIG. 3 was prepared by bonding a first ceramic member, with a diameter of 8 mm and a thickness of 1 mm, to a crystal resonator element of type HC-45/U by an electrically conductive adhesive, which first ceramic member had a resistance of 20Ω at 25° C. and a Curie point of 30° C.; housing the thus bonded crystal resonator element and the first ceramic member in a metallic vessel of 10×15×20 mm; bonding two second ceramic members one above the other to the inner surface of the bottom of the metallic vessel by an electrically conductive adhesive, which second ceramic member had the same sizes, the same Curie points, and the same resistances; and electrically connecting all the three ceramic members in series, while providing a spacing of 2 mm between the crystal resonator element and the second ceramic member.

The operating characteristics of the sample unit thus prepared was tested by applying an actuating voltage of 13.5 V across the serial circuit including the first and second ceramic members and by varying the ambient temperature from −30° C. to +60° C. The sample had an excellent temperature gain of about 15 because the variation of the temperature of the crystal resonator element thereof was between 63° C.±3° C.

EXAMPLE 4

Another sample of the temperature-compensated resonator unit according to the present invention as shown in FIG. 2 was prepared by bonding one first ceramic member, with a diameter of 8 mm and a thickness of 1 mm, to each of the opposite surfaces of a crystal resonator element of type HC-43/U by an electrically conductive adhesive, each of which first ceramic members had a resistance of 30Ω at 25° C. and a Curie point of 35° C.; covering the thus bonded crystal resonator element and the first ceramic elements in a thermally shrinkable silicone tube; housing the thus bonded crystal resonator element and the first ceramic members in a metallic vessel of 15×20×20 mm; bonding a second ceramic member to the inner surface of the bottom of the metallic vessel by welding, which ceramic member had a diameter of 10 mm, a thickness of 1 mm, a resistance of 10Ω at 25° C., and a Curie point of 30° C.; and electrically connecting the two first ceramic members in parallel and electrically connecting the second ceramic member to the first ceramic members in series.

The operating characteristics of the sample unit thus prepared was tested by applying an actuating voltage of 13.5 V across the serial circuit including the first and second ceramic members and by varying the ambient temperature from −30° C. to +60° C. The sample had an excellent temperature gain of about 15 because the variation of the temperature of the crystal resonator element thereof was between 66° C.±3° C.

As described in detail in the foregoing, in the case of Examples 1 through 4, when the ambient temperature is low, the first ceramic member which is attached to the crystal resonator element in a thermally conductive manner acts to directly heat the crystal resonator element, while as the ambient temperature rises, the resistance value of the second ceramic member electrically connected in series to the first ceramic member increases in response to both the temperature rise in the vessel by the heat from the first ceramic member and the ambient temperature rise, so as to reduce the power consumed by the first ceramic member for directly heating the crystal resonator element. Accordingly, the temperature variation of the crystal resonator element is suppressed to a very small value even when the ambient temperature varies widely, and the temperature gain of the crystal resonator element can be improved easily to 10 or more. The second ceramic member does not come into direct contact with either of the crystal resonator element and the first ceramic member, so that the ambient temperature variation does not cause any hysteresis in the temperature of the crystal resonator element, and any dispersions of the resistance values of the ceramic members caused during the manufacture thereof do not result in a poor temperature gain of the temperature-compensated crystal resonator unit. In short, the present invention provides a temperature-compensated crystal resonator unit, which is simple in structure, small in size, low in cost, and yet has a large temperature gain as compared with those of the conventional crystal resonator units.

EXAMPLE 5

To prepare a sample of the temperature-compasated resonator unit having first, second and third ceramic members, a first ceramic member with a diameter of 6 mm and a thickness of 1 mm and a Curie point of 50° C. was bonded to crystal resonator element of type HC-45/U by an electrically conductive adhesive, and the thus bonded crystal resonator element and the first ceramic member was housed in a metallic vessel of 10×15×20 mm. Two second ceramic members of the same size and having a Curie point of 40° C. were bonded to the inner surface of the bottom of the metallic vessel by an electrically conductive adhesive, which second ceramic members were electrically connected in parallel to each other, and the parallel second ceramic members were electrically connected in series to the first ceramic member. A third ceramic member with the same size and a Curie point of 40° C. was bonded to the cover of the vessel by an electrically conductive adhesive, and the third ceramic member was electrically connected in parallel to the serial circuit including the first and second ceramic members. The sample unit was completed by thermally insulating the unit with a foamed polystyrene layer with a thickness of 3 mm, which layer enclosed the outer surface of the metallic vessel.

Figure 8A:
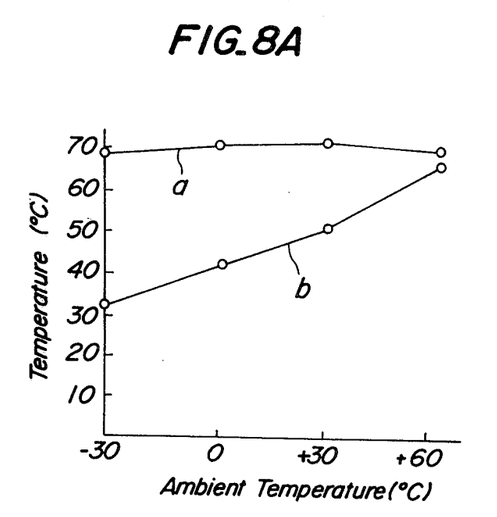
FIGS. 8A, 8B, 9A, and 9B are graphs showing operating characteristics of those examples of the invention which use the third ceramic member.
Figure 8B:
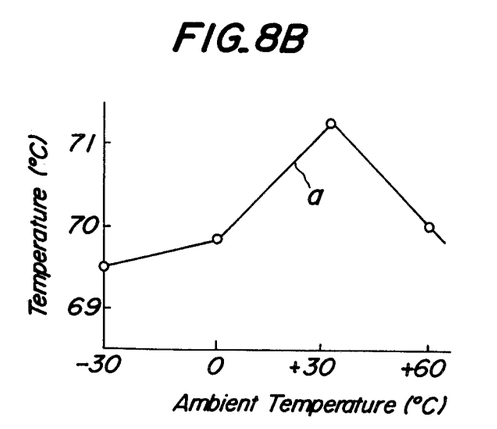

The operating characteristics of the sample of the invention thus prepared was tested by applying an actuating voltage of 10 V across the serial circuit including the ceramic members and by varying the ambient temperature from −30° C. to +60° C. The result is shown in FIGS. 8A and 8B: namely, the temperature gain of the sample was 50 because the variation of the temperature of the crystal resonator element was 69.5° C. to 71.3° C. when the ambient temperature vaired by 90° C. from −30° C. to +60° C. Thus, this sample was proved to be very stable. In FIG. 8A, the curve a shows the temperature change of the crystal resonator element, while the curve b shows the temperature change of the vessel which was 32° C. to 67° C. FIG. 8B shows the temperature change of the crystal resonator element on an enlarged temperature scale.

A reference crystal resonator unit was made by using the same construction as that of the above-mentioned sample of the invention except the elimination of the third ceramic member. The temperature gain of the reference unit was only 12.8 because the temperature of the crystal resonator element thereof varied from 61° C. to 68° C.

EXAMPLE 6

To prepare another sample of the temperature-compensated resonator unit having first, second, and third ceramic members, a first ceramic member with a diameter of 6 mm and a thickness of 1 mm and a Curie point of 50° C. was bonded to a crystal resonator element of type HC-45/U by an electrically conductive adhesive, and the thus bonded crystal resonator element and the first ceramic member was housed in a metallic vessel of 10×15×20 mm. Two second ceramic members of the same size and having Curie point of 30° C. and 40° C. respectively were bonded to the inner surface of the bottom of the metallic vessel by an electrically conductive adhesive, which second ceramic members were electrically connected in parallel to each other, and the parallel second ceramic members were electrically connected in series to the first ceramic member. Three third ceramic members with the same size and a Curie point of 30° C. were bonded to the cover of the vessel by an electrically conductive adhesive in an electrically parallel manner to each other, and the third ceramic members were electrically connected in parallel to the serial circuit including the first and second ceramic members. The sample unit was completed by thermally insulating the unit with a silicone rubber layer with a thickness of 2 mm enclosing the outer surface of the metallic vessel.

Figure 9A:
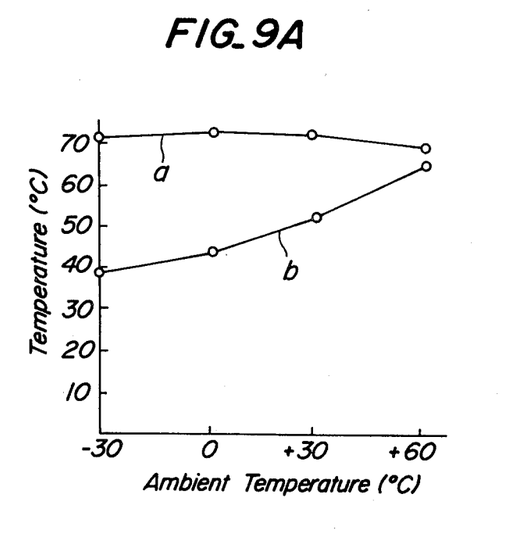
Figure 9B:
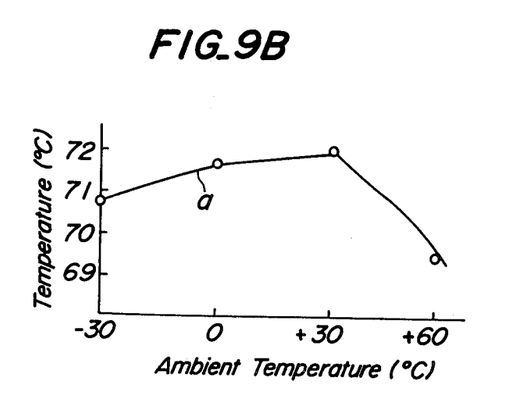

The operating characteristics of the sample of the invention thus prepared was tested by applying an actuating voltage of 10 V across the serial circuit including the ceramic members and by varying the ambient temperature from −30° C. to +60° C. The result is shown in FIGS. 9A and 9B: namely, the temperature gain of the sample was 32.1 because the variation of the temperature of the crystal resonator element was 69.2° C. to 72° C. when the ambient tempetature vaired by 90° C. from −30° C. to +60° C. Thus, this sample was proved to be very stable. In FIG. 9A, the curve a shows the temperature change of the crystal resonator element, while the curve b shows the temperature change of the vessel which was 39° C. to 64.5° C. FIG. 9B shows the temperature change of the crystal resonator element on an enlarged scale.

As described in detail in the foregoing, in the case of Examples 5 and 6, when the ambient temperature is low, the first ceramic member which is attached to the crystal resonator element in a thermally conductive manner acts to directly heat the crystal resonator element. While, as the ambient temperature rises, the resistance value of the second ceramic member, which is electrically connected in series to the first ceramic member and heat-conductively bonded to the vessel carrying the crystal resonator element and the first ceramic member, increases by sensing the ambient temperature rise, so as to reduce the heat generation by the first ceramic member. In addition, the third ceramic member, which is connected in parallel to the serial circuit including the first and second ceramic members, acts to adjust the vessel temperature so as to compensate for the ambient temperature variation. Whereby, the temperature variation of the vessel carrying the crystal resonator element is kept to about one third of the ambient temperature variation, as demonstrated in Examples 5 and 6, so that the temperature variation of the crystal resonator element is suppressed to a very low level, and the temperature gain thereof can be easily improved to 20 or more.

Both of the second ceramic member and the third ceramic member do not come into direct contact with either of the crystal resonator element and the first ceramic member, so that the ambient temperature variation hardly causes any hysteresis in the temperature of the crystal resonator element, and any dispersions of the resistance values of the ceramic members caused during the manufacture thereof do not result in a poor temperature gain of the temperature-compensated crystal resonator unit.

In short, the present invention provides a temperature-compensated crystal resonator unit, which is simple in structure, small in size, low in cost, and yet has a large temperature gain as compared with those of the conventional crystal resonator units.

Although the invention has been described with a certain degree of particularity, it is understood that the present disclosure has been made only by way of example and numerous changes in details of construction and the arrangement of parts may be resorted to without departing from the scope of the invention as hereinafter claimed.

What is claimed is:

1. A temperature-compensated crystal resonator unit comprising a crystal resonator element housed in a vessel, a first ceramic member attached to the crystal resonator element in a heat-conductive manner, said first ceramic member having a positive temperature coefficient of electric resistance, and a second ceramic member being mounted on said vessel in a heat-conductive manner and being electrically connected to said first ceramic member in series thereto, said second ceramic member having a positive temperature coefficient of electric resistance and being spaced from both said crystal resonator element and said first ceramic member.

2. A temperature-compensated crystal resonator unit as set forth in claim 1, wherein said temperature coefficient of the first ceramic member is larger than said temperature coefficient of the second ceramic member at room temperatures and at temperatures below room temperature.

3. A temperature-compensated crystal resonator unit as set forth in claim 1, wherein said crystal resonator element has a thermal capacity which is smaller than the thermal capacity of said vessel.

4. A temperature-compensated crystal resonator unit comprising a crystal resonator element housed in a vessel, at least one first ceramic member attached to the crystal resonator element in a heat-conductive manner, said first ceramic member having a positive temperature coefficient of electric resistance, at least one second ceramic member being mounted on said vessel in a heat-conductive manner and being electrically connected to said first ceramic member in series thereto, said second ceramic member having a positive temperature coefficient of electric resistance, and at least one third ceramic member being mounted on said vessel in a heat-conductive manner and being electrically connected in parallel to a circuit formed of said first and second ceramic members, said third ceramic member having a positive temperature coefficient of electric resistance, both of said crystal resonator element and said first ceramic member being spaced from any of said vessel, said second ceramic member and said third ceramic member.

* * * * *